United States Patent
Reyes et al.

(10) Patent No.: US 6,762,495 B1
(45) Date of Patent: Jul. 13, 2004

(54) AREA ARRAY PACKAGE WITH NON-ELECTRICALLY CONNECTED SOLDER BALLS

(75) Inventors: Edward Reyes, San Diego, CA (US); Ryan Lane, San Diego, CA (US); Tiona Marburger, San Diego, CA (US); Tom Gregorich, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/393,666

(22) Filed: Mar. 20, 2003

Related U.S. Application Data

(60) Provisional application No. 60/443,817, filed on Jan. 30, 2003.

(51) Int. Cl.[7] ............................................. H01L 23/48
(52) U.S. Cl. ..................... 257/737; 257/738; 257/697; 438/109; 438/613; 228/180.22
(58) Field of Search ................................ 257/737, 738, 257/697; 438/109, 613, 125; 228/180.22

(56) References Cited

U.S. PATENT DOCUMENTS

| | | | | | |
|---|---|---|---|---|---|
| 6,118,182 | A | * | 9/2000 | Barrow ........................ | 257/773 |
| 6,229,218 | B1 | * | 5/2001 | Casey et al. ................ | 257/778 |
| 6,242,815 | B1 | * | 6/2001 | Hsu et al. .................... | 257/786 |
| 6,246,121 | B1 | * | 6/2001 | Dandia et al. .............. | 257/778 |
| 6,255,702 | B1 | * | 7/2001 | Iwata et al. ................. | 257/384 |
| 6,265,783 | B1 | * | 7/2001 | Juso et al. ................... | 257/786 |
| 6,285,560 | B1 | * | 9/2001 | Lyne ........................... | 361/760 |
| 6,288,445 | B1 | * | 9/2001 | Kimura ....................... | 257/737 |
| 6,323,559 | B1 | * | 11/2001 | Chan et al. .................. | 257/778 |
| 6,365,978 | B1 | * | 4/2002 | Ibnabdeljalil et al. ....... | 257/786 |
| 6,400,019 | B1 | * | 6/2002 | Hirashima et al. .......... | 257/737 |
| 6,403,896 | B1 | * | 6/2002 | Ma et al. ..................... | 174/261 |
| 6,448,639 | B1 | * | 9/2002 | Ma .............................. | 257/691 |
| 6,459,161 | B1 | * | 10/2002 | Hirata et al. ................. | 257/786 |
| 6,492,254 | B2 | * | 12/2002 | Sturcken et al. ............ | 438/613 |
| 6,552,425 | B1 | * | 4/2003 | Yan et al. .................... | 257/690 |
| 6,608,382 | B2 | * | 8/2003 | Liu et al. ..................... | 257/737 |
| 6,617,699 | B2 | * | 9/2003 | Bobba et al. ................ | 257/786 |
| 6,650,014 | B2 | * | 11/2003 | Kariyazaki .................. | 257/737 |
| 6,661,082 | B1 | * | 12/2003 | Granada et al. ............. | 257/676 |
| 6,664,625 | B2 | * | 12/2003 | Hiruma ....................... | 257/700 |
| 6,667,561 | B2 | * | 12/2003 | Baker .......................... | 257/786 |
| 6,696,763 | B2 | * | 2/2004 | Chen et al. .................. | 257/778 |
| 2002/0079577 | A1 | * | 6/2002 | Ho .............................. | 257/737 |

* cited by examiner

Primary Examiner—Jasmine Clark
(74) Attorney, Agent, or Firm—Philip R. Wadsworth; Charles D. Brown; George C. Peppes

(57) ABSTRACT

An area area package includes a plurality of solder balls not used as electrical connectors. These non-connected solder balls, or "dummy balls," provide protection to solder balls connected to live pins and therefore increase reliability of the area array package. The dummy balls may be placed in the corners, along the diagonals or in other high stress location on the area array package. To further increase reliability, a continuous copper ball land pad may be used to connect each group of corner dummy balls. Continuous copper pads help to reduce stress on the dummy balls. For center-depopulated BGA packages, an array of dummy balls may be used in the center of the package to prevent substrate bending and improve drop test reliability.

15 Claims, 4 Drawing Sheets

AREA ARRAY PACKAGE WITH NON-ELECTRICALLY CONNECTED SOLDER BALLS

RELATED APPLICATIONS

This application claims benefit of U.S. Provisional Patent Application No. 60/443,817, filed Jan. 30, 2003 and entitled "AREA ARRAY PACKAGE WITH IMPROVED RELIABILITY OF SOLDER JOINTS."

TECHNICAL FIELD

The present application relates to area array packages, and more particularly to increasing the reliability of solder joints of an area array package subjected to environmental stresses.

BACKGROUND

Semiconductor integrated circuit chips have to be connected in order to enable them to interact electrically with the outside world. A ball grid array (BGA) semiconductor chip package employs a plurality of solder balls as external terminals. A BGA package is widely employed because it allows a multi-pin structure over a limited area.

Chip devices typically have a coefficient of thermal expansion (CTE) of about 3 ppm/C. These devices are relatively stiff and can fracture in a brittle manner if stressed by excessive bending. An area array package includes a chip, a package substrate, and optional molding. The CTE of the area array package is affected by each component of the package.

An epoxy-glass printed circuit board can have a CTE in the range of about 16 to 21 ppm/C, depending on the glass cloth, resin system, and copper content. It is necessary to provide a physical connection between the area array package and the printed circuit board in order to obtain a useful electrical connection.

A mismatch in CTE that exists between an area array package and a printed circuit board contributes to thermally driven stress and can affect package reliability in many ways. In some manner, all electronics packaging schemes involving an area array package and a printed circuit board are affected by this fundamental mismatch in CTE. Measurements on semiconductor packages of the ball-grid array (BGA) type and chips-size (CSP) type found that solder joints located close to package corners are under particularly heavy strain due to mismatch in CTE.

As the land pad pitch and size shrinks, solder joint reliability is typically decreased. The area array package requires a packaging scheme to form and maintain electrical contacts between the package and a printed circuit board over the entire face of a device. Temperature-dependent shear strains exist between the area array package and the printed circuit board. There is a very predictable, finite fatigue life of solder ball connections. Additionally, area array packages are also subject to mechanical stresses not related to the CTE. These stresses include mechanical bending and other environmental stresses.

Stresses between the area array package and the printed circuit board leads to the need for protection of solder balls that provide electrical connection. The protection of the solder balls that provide electrical connection should provide sufficient relief such that strains on solder connections are reduced to acceptable levels so that fatigue life improvement is realized.

SUMMARY

An area array package includes a plurality of solder balls not used as electrical connectors. These non-connected solder balls, or "dummy balls," provide protection to solder balls connected to live pins and therefore increase reliability of the area array package. The dummy balls may be placed in the corners, along the diagonals or in other high stress locations on the area array package. To further increase reliability, a continuous copper ball land pad may be used to connect each group of corner dummy balls. Continuous copper pads help to reduce stress on the dummy balls. For center-depopulated BGA packages, an array of dummy balls may be used in the center of the package to prevent substrate bending and improve drop test reliability.

Improving the reliability of area array packages using dummy balls and advantages of the embodiments will become more apparent upon reading the following detailed description and upon reference to the accompanying drawings.

DETAILED DESCRIPTION

Figure 1:
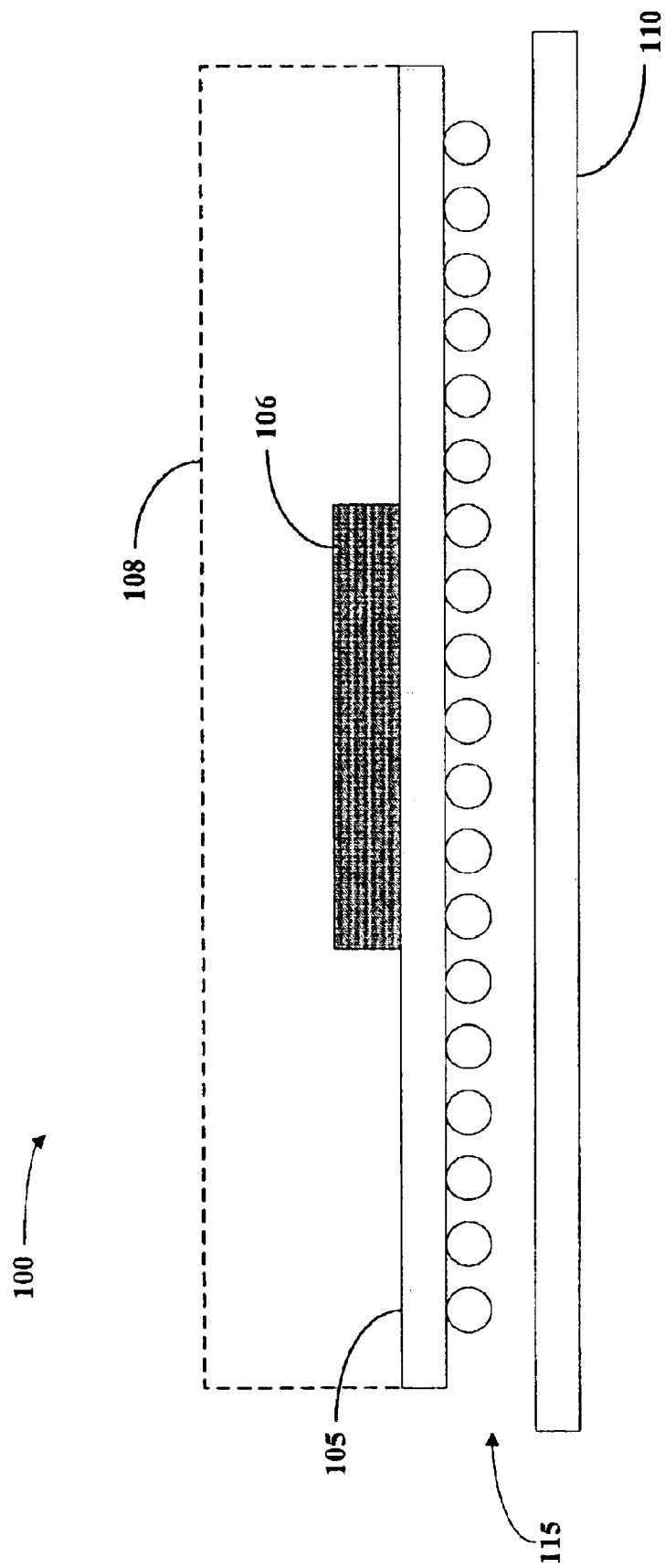
FIG. 1 illustrates an area array package connected to a printed circuit board.

FIG. 1 illustrates an area array package 100. The area array package 100 includes a substrate 105, a die 106, and optional molding 108. The substrate 105 may be composed of different materials, including ceramic, laminate, or polyimide tape. The die 106 is typically a silicon chip and is connected to the substrate 105. The die 106 may be wire bonded or be flip chip attached to the substrate 105. Molding 108 may be placed around the die 106 to protect the die 106. Molding 108 is typically used when the die 106 is wire bonded to the substrate 105, but may also be used even if the die 106 is flip chip attached.

The area array package 100 is mounted on a printed circuit board 110 or similar component. The printed circuit board 110 is typically a laminate. The area array package 100 is connected to the printed circuit board 110 by a plurality of solder balls 115. The solder balls 115 may provide both a mechanical and electrical connection between the area array package 100 and the printed circuit board 110.

Figure 2:
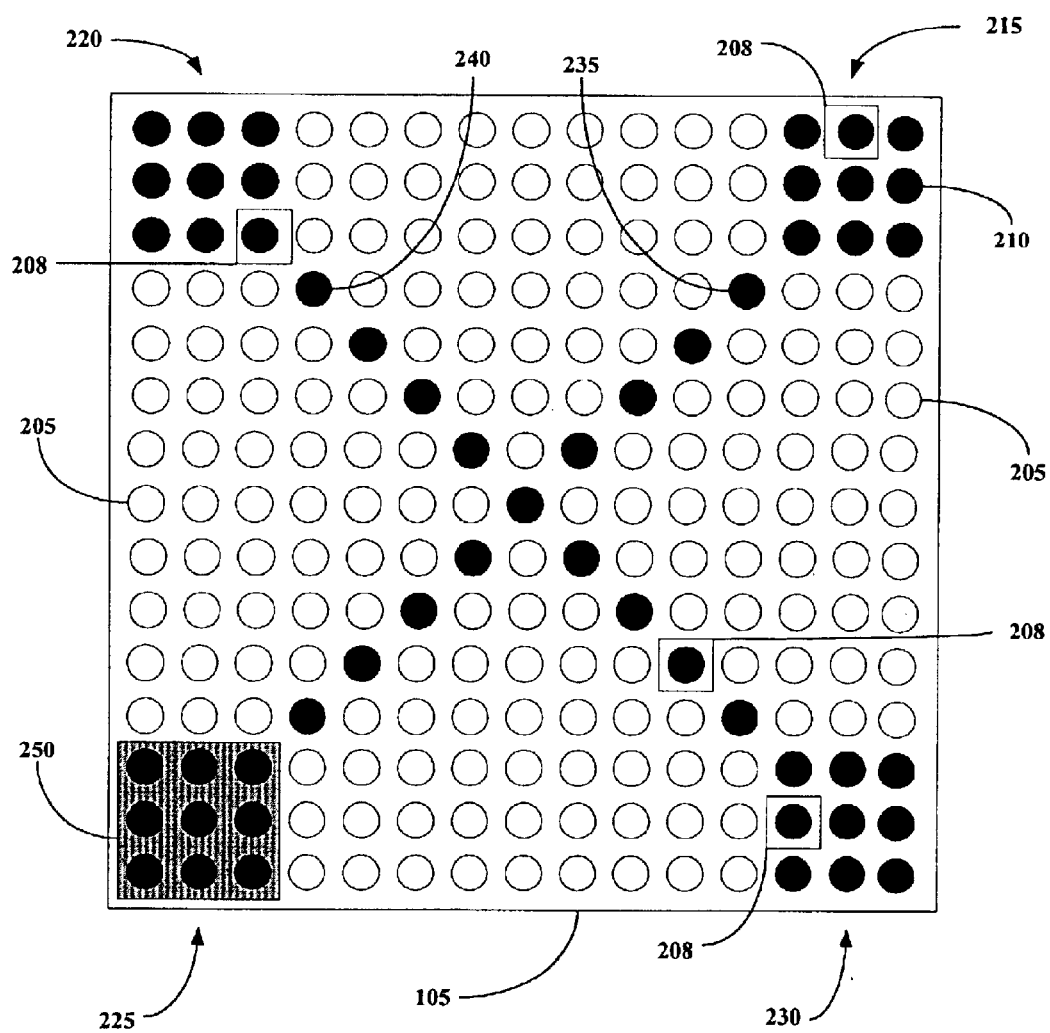
FIG. 2 illustrates dummy ball configuration on the area array package.

FIG. 2 illustrates the solder ball connections 115 between the area array package 100 and the printed circuit board 110. The solder ball connections 115 are typically placed on the bottom of the substrate 105 of the area array package 100. In the present invention, two types of solder ball connections 115 are used. The first type of solder ball connection 205 provides both a mechanical and electrical interface between the area array package 100 and the printed circuit board 110. Thus, in addition to physically holding the area array package 100 to the printed circuit board 110, the solder ball connections 205 permit the transmission of electrical signals between the area array package 100 and the printed circuit board 110. This type of solder ball connection 205 is typical of those found in BGA applications. The second type of solder ball connection is a dummy ball 210. Dummy balls 210 provide only mechanical connection between the area array package 100 and the printed circuit board 110. The dummy balls 210 are not connected to any electrical signal lines.

In one embodiment of the invention, the area array package 100 includes solder ball pads 208. Each solder ball pad 208 is adapted to receive a solder ball. In FIG. 2, only a sampling of solder ball pads 208 are illustrated for clarity, although a solder ball pad 208 is typically located in each position adapted to receive a solder ball. The solder ball pads 208 in each corner 215, 220, 225, 230 of the area array package 100 and along the diagonals 235, 240 connecting the corners 215, 220, 225, 230 of the area array package 100 do not have electrical connections to the area array package 100. These solder ball pads 208 without electrical connections are configured to use dummy balls 210.

Measurements on semiconductor packages found that the solder joints located close to the package corners are under particularly heavy strain. By designing an area array package 100 to not have electrical connections in the corners 215, 220, 225, 230 and along the diagonals 235, 240 connecting the corners 215, 220, 225, 230 of the area array package 100, standard solder joints may be replaced with the dummy balls 210. Replacing standard solder joints with dummy balls 210 allows the heavy strain experienced in the corners and diagonals to be absorbed by the dummy balls 210. Because the dummy balls 210 do not contain any electrical connections, the strain applied to the dummy balls 210 cannot cause a sensitive electrical connection to break. In addition, designing an area array package 100 with no electrical connections along the diagonals 235, 240 also allows dummy balls 210 to be placed along the diagonals 235, 240 to further absorb the stresses and strains without breaking any electrical connections.

Empirical tests conducted with the dummy balls 210 show the dummy balls 210 failing long before the regular solder balls in both the temperature cycles before failure and the bend to fail tests. Because the dummy balls 210 do not have the electrical connections, their failure does not cause the connection between the area array package 100 and the printed circuit board 110 to fail. By locating the dummy balls 210 in the high stress positions, the overall life of the array package 100 is increased. Table 1 illustrates the testing.

TABLE 1

| Sample | I/O Circuit | Dummy Balls |
|---|---|---|
| | Temperature Cycle (cycles to failure) | |
| 1 | 1455 | 379 |
| 2 | 2065 | 140 |
| 3 | 1759 | 1070 |
| 4 | 1750 | 467 |
| 5 | 426 | 189 |
| 6 | 1923 | 329 |
| 7 | 916 | 176 |
| 8 | 1184 | 134 |
| 9 | 1797 | 121 |
| 10 | 1425 | 211 |
| 11 | 1898 | 1269 |
| 12 | 2315 | 417 |
| 13 | 1805 | 737 |
| 14 | 768 | 218 |
| 15 | 1849 | 1075 |
| 16 | 1809 | 171 |
| 17 | 1946 | 375 |
| 18 | 1075 | 589 |
| 19 | 2259 | 387 |
| 20 | 2300 | 125 |
| Avg | 1636 | 429 |

TABLE 1-continued

| Sample | I/O Circuit | Dummy Balls |
|---|---|---|
| | Bend To Fail (mm deflection) | |
| 1 | 14.5 | 10 |
| 2 | 15.5 | 15 |
| 3 | 15 | 14.5 |
| 4 | 19 | 14.5 |
| 5 | 15 | 14.5 |
| 6 | 16 | 13.5 |
| 7 | 14 | 12.5 |
| 8 | 15.5 | 13 |
| 9 | 18.5 | 18 |
| 10 | 18 | 14 |
| 11 | 14 | 8 |
| 12 | 16 | 7.5 |
| 13 | 15 | 14 |
| Avg | 16 | 13 |

To further reduce the stress on the dummy balls 210, a continuous copper ball land pad 250 may be placed under the dummy balls 210 in one or more of the corners 215, 220, 225, 230. The copper pad 250 is placed between the dummy balls 210 and the substrate 105. The copper pad 250 provides a uniform landing area and further reduces the stress on the corner dummy balls 210. Modeling data conducted with the copper pads 250 show an increase in the number of temperature cycles before failure. Table 2 illustrates the testing.

TABLE 2

| | Temp Cycles to Failure | |
|---|---|---|
| Dummy Ball | Without Copper Pad | With Copper Pad |
| 1 | 920 | 987 |
| 2 | 3216 | 3750 |
| 3 | 3099 | 3793 |
| 4 | 2475 | 2617 |

Figure 3:
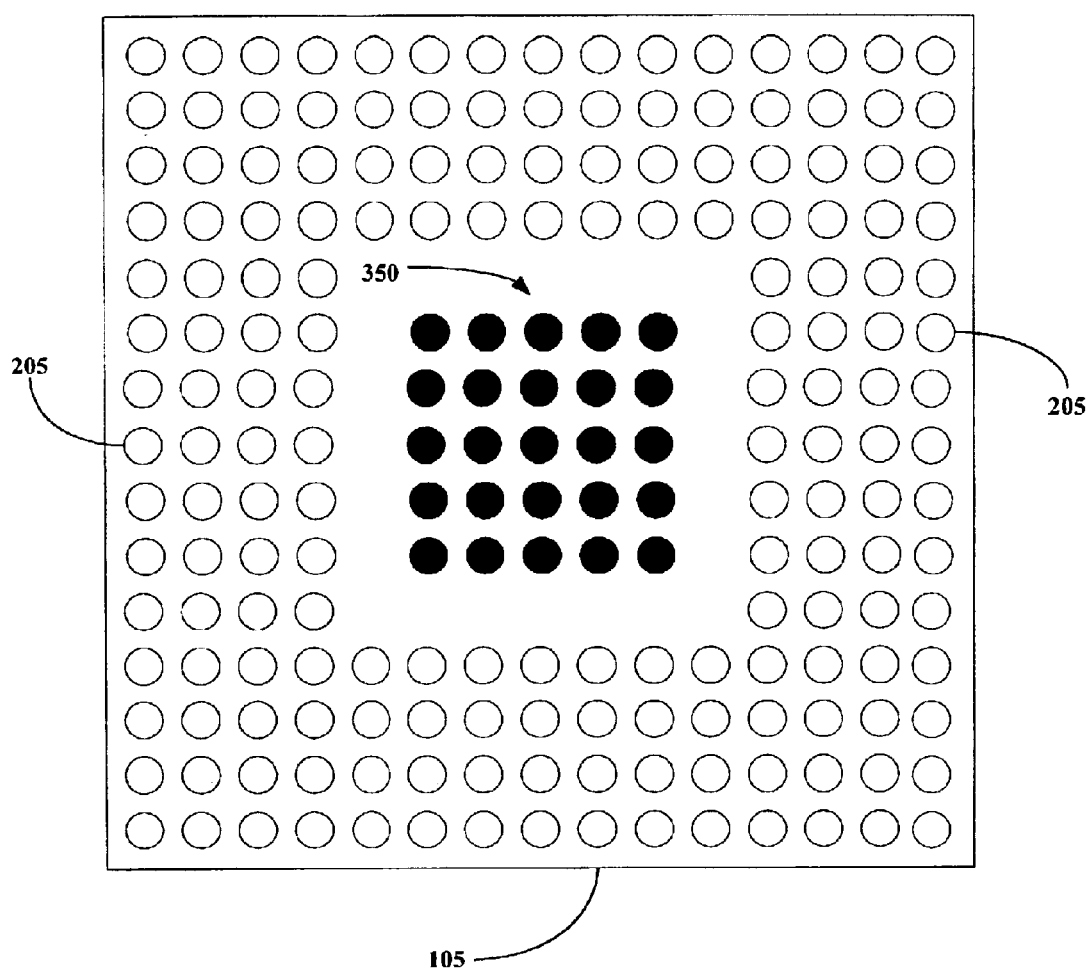
FIG. 3 illustrates an optional center dummy ball configuration for center-depopulated area array packages.

FIG. 3 illustrates an alternative arrangement of the solder ball connections 115 between the area array package 100 and the printed circuit board 110 for a center depopulated package. In this embodiment, an array of dummy balls 350 is positioned in the center of the area array package 100 in the depopulated region. The array of dummy balls 350 positioned in the center prevents substrate bending during electrical testing and provides more solder joints to improve drop-test reliability. The array of dummy balls 350 positioned in the center may also be combined with the use of dummy balls on the corners and diagonals to enhance reliability.

Figure 4:
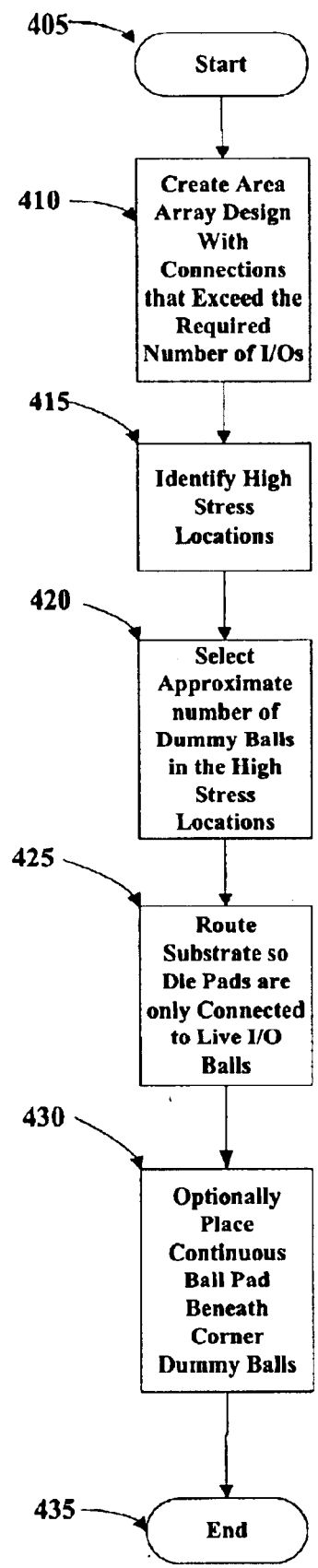
FIG. 4 is a flowchart illustrating how to prepare a connection between the area array package and the printed circuit board to increase reliability.

FIG. 4 is a flowchart illustrating how to prepare a connection between the area array package 100 and the printed circuit board 110 to increase reliability. The process begins in a START block 405. Proceeding to block 410, a package outline is created for the area array package 100. The package outline includes a plurality of solder balls 115 that exceed the number of the input/output (I/O) requirements of the chip device 106. By including a high number of solder balls 115, not every solder ball 115 needs to be used as an I/O connection. This allows some of the solder balls 115 to be used as dummy balls 210.

Proceeding to block 415, high stress locations along the connection between the area array package 100 and the printed circuit board 110 are identified. The high stress locations are those locations where failure of the solder balls 115 is likely to first occur when subjected to environmental or other stresses. High stress locations may be identified by modeling data (computer simulation), empirical tests, or other appropriate technique.

Proceeding to block 420, for each of the high stress locations, an appropriate number of solder balls 115 are selected to be dummy balls 210. The number of dummy balls 210 to use for each area is selected based on target performance levels and the required number of I/O connections required. As described above, high stress areas are typically found in the corners and along the diagonals of the area array package 100. Thus, dummy balls 210 are placed in these areas, as illustrated in FIG. 2. The configuration in FIG. 2 is illustrative only, and the number of dummy balls 210 to use in each area of high stress may vary based on the target performance levels and the required number of I/O connections required When a center-depopulated package is used, an array of dummy balls may optionally be placed in the center of the area array package 100. The center dummy balls may be used with or without the dummy balls in the corners and the diagonals. The center dummy balls may be placed in a rectangular or square layout, but other types of layouts may also be used.

Proceeding to block 425, the substrate is routed so the die pads are only connected to locations containing live I/O solder balls. No electrical connections are made between the die pads and the dummy balls.

Proceeding to block 430, a continuous copper or other pad may be placed between the dummy balls in the corners and the area array package 100. The continuous copper pads improve the resistance of the corner dummy balls to environmental stresses. The use of the copper pads is optional.

After the package is designed and the dummy balls are placed, empirical testing may be performed to determine if the package meets the target stress levels. If the target levels are not met, further modifications of the design may be made. Once the target levels are met, the process terminates in END block 435.

Although the present device has been fully described in connection with the preferred embodiments thereof with reference to the accompanying drawings, it is to be noted that various changes and modifications will become apparent to those skilled in the art. Such changes and modifications are to be understood as being included within the scope of the present device as defined by the appended claims.

What is claimed is:

1. A device comprising:
   a printed circuit board;
   an area array package having corners;
   a first set of solder balls electrically connecting the area array package to the printed circuit board; and
   a second set of solder balls providing physical connection but no electrical connection, the second set being configurably disposed in at least one of the corners of the area array package and along diagonals, with respect to the corners, of the area array package.

2. The device of claim 1, wherein the second set of solder balls further includes solder balls disposed in the center of the area array package.

3. The device of claim 1, wherein at least one of the second set of solder balls located in one of the corners of the area array package is positioned on a continuous ball pad.

4. The device of claim 3, wherein the continuous ball pad is a metal pad.

5. A device comprising:
   a printed circuit board;
   an area array package;
   a first set of solder balls electrically connecting the area array package to the printed circuit board; and
   a second set of solder balls providing physical connection but no electrical connection, the second set being configurably disposed in a center of the area array package.

6. A method of improving reliability between an area array package having corners and a printed circuit board comprising:
   providing a first plurality of solder balls not used for electrical connection between the area array package and the printed circuit board, wherein the first plurality of solder balls are configurably disposed in at least one of the corners of the area array package and along diagonals, with respect to the corners, of the area array package; and
   providing a second plurality of solder balls which electrically connect the area array package and the printed circuit board.

7. The method of claim 6, further providing a third plurality of solder balls disposed in the center of the area array package.

8. The method of claim 6, further comprising positioning the portions of the first plurality of solder balls disposed in the corners on a continuous ball pad.

9. The method of claim 8, wherein the continuous ball pad is a metal pad.

10. An area array package having corners comprising:
    a first set of solder ball pads configured to transfer electrical signals to the area array package; and
    a second set of solder ball pads having no electrical connections, the second set of solder ball pads configured to provide only physical connection to the area array package, the second set of solder ball pads being configurably disposed in at least one of the corners of the area array package and along diagonals, with respect to the corners, of the area array package.

11. The area array package of claim 10, wherein the second set of solder ball pads further includes solder ball pads disposed in the center of the area array package.

12. The area array package of claim 10, wherein at least one of the second set of solder ball pads located in one of the corners of the area array package comprises a continuous ball pad.

13. The area array package of claim 12, wherein the continuous ball pad is a metal pad.

14. A method of designing an area array package having corners comprising:
    disposing a first plurality of solder ball pads not used for electrical connection with the area array package in at least one of the corners of the area array package and along diagonals, with respect to the corners, of the area array package; and
    providing a second plurality of solder ball pads adapted to allow electrical connection to the area array package.

15. The method of claim 14, further providing a third plurality of solder ball pads not used for electrical connection disposed in the center of the area array package.

* * * * *